(12) United States Patent
Motoyoshi

(10) Patent No.: US 10,115,695 B1
(45) Date of Patent: Oct. 30, 2018

(54) SOLID-STATE IMAGING DEVICE

(71) Applicant: TOHOKU-MICROTEC CO., LTD, Sendai-shi, Miyagi (JP)

(72) Inventor: Makoto Motoyoshi, Miyagi (JP)

(73) Assignee: TOHOKU-MICROTEC CO., LTD, Sendai-shi (JP)

( * ) Notice: Subject to any disclaimer, the term of this patent is extended or adjusted under 35 U.S.C. 154(b) by 0 days.

(21) Appl. No.: 15/851,898

(22) Filed: Dec. 22, 2017

(30) Foreign Application Priority Data

Apr. 28, 2017 (JP) .................................. 2017-89871

(51) Int. Cl.
| | |
|---|---|
| *H01L 23/492* | (2006.01) |
| *H01L 23/00* | (2006.01) |
| *H01L 27/146* | (2006.01) |
| *H01L 21/822* | (2006.01) |
| *H01L 25/11* | (2006.01) |

(52) U.S. Cl.
CPC .............. *H01L 24/17* (2013.01); *H01L 24/11* (2013.01); *H01L 24/16* (2013.01); *H01L 27/1469* (2013.01); *H01L 27/14634* (2013.01); *H01L 21/8221* (2013.01); *H01L 24/14* (2013.01); *H01L 25/117* (2013.01); *H01L 2224/1145* (2013.01); *H01L 2224/11466* (2013.01); *H01L 2224/11472* (2013.01); *H01L 2224/16054* (2013.01); *H01L 2224/16058* (2013.01); *H01L 2224/16059* (2013.01); *H01L 2224/16145* (2013.01); *H01L 2224/1713* (2013.01); *H01L 2224/17051* (2013.01); *H01L 2224/17104* (2013.01)

(58) Field of Classification Search
CPC ........... H01L 24/14; H01L 2224/13016; H01L 21/8221; H01L 25/117
USPC ............................................ 257/258; 438/67
See application file for complete search history.

(56) References Cited

U.S. PATENT DOCUMENTS

| | | | | |
|---|---|---|---|---|
| 5,569,960 A | * | 10/1996 | Kumazawa | H01L 23/3128 257/738 |
| 6,025,998 A | * | 2/2000 | Kitade | H05K 3/3405 174/361 |
| 6,330,166 B1 | * | 12/2001 | Aoyama | H01L 23/49816 174/260 |
| 6,373,139 B1 | * | 4/2002 | Clark | H01L 23/49838 257/737 |

(Continued)

FOREIGN PATENT DOCUMENTS

| | | |
|---|---|---|
| WO | 2014/006812 A1 | 1/2014 |
| WO | 2017/081798 A1 | 5/2017 |

*Primary Examiner* — George Fourson, III
(74) *Attorney, Agent, or Firm* — Metrolexis Law Group, PLLC

(57) ABSTRACT

A solid-state imaging device encompasses a detector substrate having a first main-surface, on which a plurality of first lands are arranged in a matrix, and a signal-circuit substrate having a second main-surface, on which plurality of second lands are arranged so as to face the arrangement of the first lands. A plurality of tubular bumps, each of which having a flattened plane pattern, and is provided between each of the first lands and each of the second lands. The tubular bumps respectively have major-axis directions to define inclined angles, and are arranged in the matrix such that the inclined angles differ depending on locations of the plurality of tubular bumps.

11 Claims, 14 Drawing Sheets

(56) References Cited

U.S. PATENT DOCUMENTS

| | | | |
|---|---|---|---|
| 2005/0266668 A1* | 12/2005 | Sawada | H01L 23/49816 438/612 |
| 2009/0229853 A1* | 9/2009 | Fukuda | B23K 1/0016 174/126.1 |
| 2009/0272563 A1* | 11/2009 | Tsai | H05K 1/111 174/255 |
| 2015/0366049 A1* | 12/2015 | Lee | G02F 1/13458 361/749 |
| 2016/0351544 A1* | 12/2016 | Machida | H01L 25/0657 |

\* cited by examiner

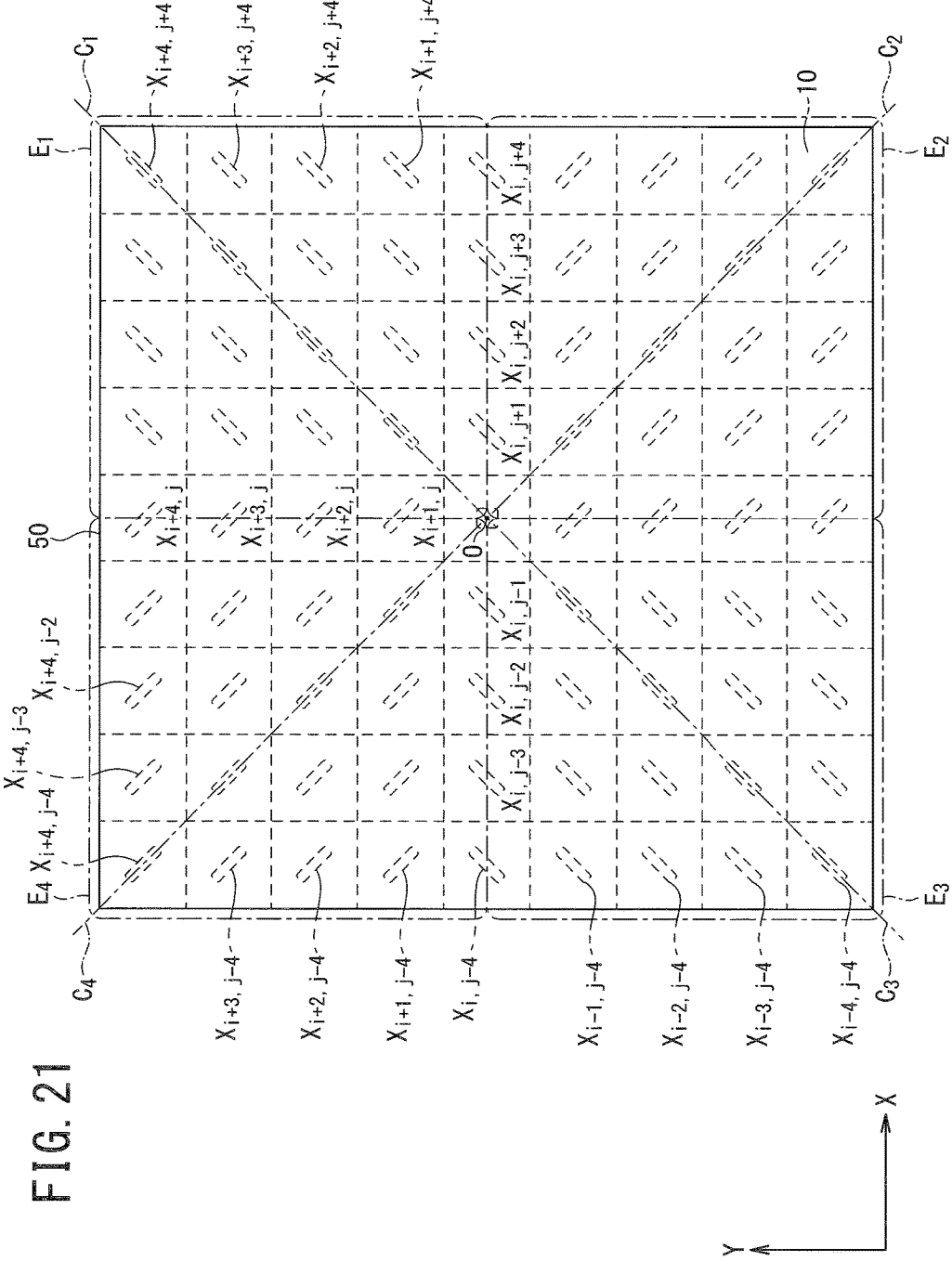

US 10,115,695 B1

SOLID-STATE IMAGING DEVICE

CROSS REFERENCE TO RELATED APPLICATIONS

This application claims priority from Japanese Patent Application No. 2017-89871, filed on Apr. 28, 2017, the entire contents of which are incorporated herein by reference.

BACKGROUND

1. Technical Field

The disclosure relates to solid-state imaging devices, and more particularly relates to solid-state imaging devices having a laminated structure suitable for use in a temperature-changing environment, which creates a temperature history.

2. Description of the Related Art

WO 2014/006812 A1 discloses a two-dimensional radiation detector having an active-matrix substrate and an opposed substrate. The active-matrix substrate includes pixel electrodes. The opposed substrate is bonded to the active-matrix substrate via conductive bumps connected to the pixel electrodes. Such a flip-chip bonding makes it difficult to connect the active-matrix substrate to the opposed substrate via the uniform bumps if the pixel electrodes are arranged with finer and finer pitches. In contrast, WO 2017/081798A1 discloses a semiconductor detector employing cylindrical electrodes for connecting pixel electrodes on a signal read-out substrate to an opposed substrate, thereby achieving a well-established connection.

The radiation detector often works in low-temperature environment, which may increase thermal stress on the bumps due to a difference in coefficient of thermal expansion between the substrates, for example. The increase in thermal stress may change characteristics of circuit elements due to substrate distortion, or release the connection via the conductive bumps.

SUMMARY

An aspect of the present invention inheres in a solid-state imaging device encompassing (a) a detector substrate having a first main-surface, on which a plurality of first lands are arranged in a matrix, (b) a signal-circuit substrate having a second main-surface, on which plurality of second lands are arranged so as to face the arrangement of the first lands, and (c) a plurality of tubular bumps, each of which having a flattened plane pattern, and is provided between each of the plurality of first lands and each of the plurality of second lands, the plurality of tubular bumps respectively having major-axis directions to define inclined angles, being arranged in the matrix such that the inclined angles differ depending on locations of the plurality of tubular bumps.

BRIEF DESCRIPTION OF THE DRAWINGS

FIG. 21 is a schematic plan view illustrating a solid-state imaging device according to still another embodiment of the present invention.

DETAILED DESCRIPTION

Figure 1:
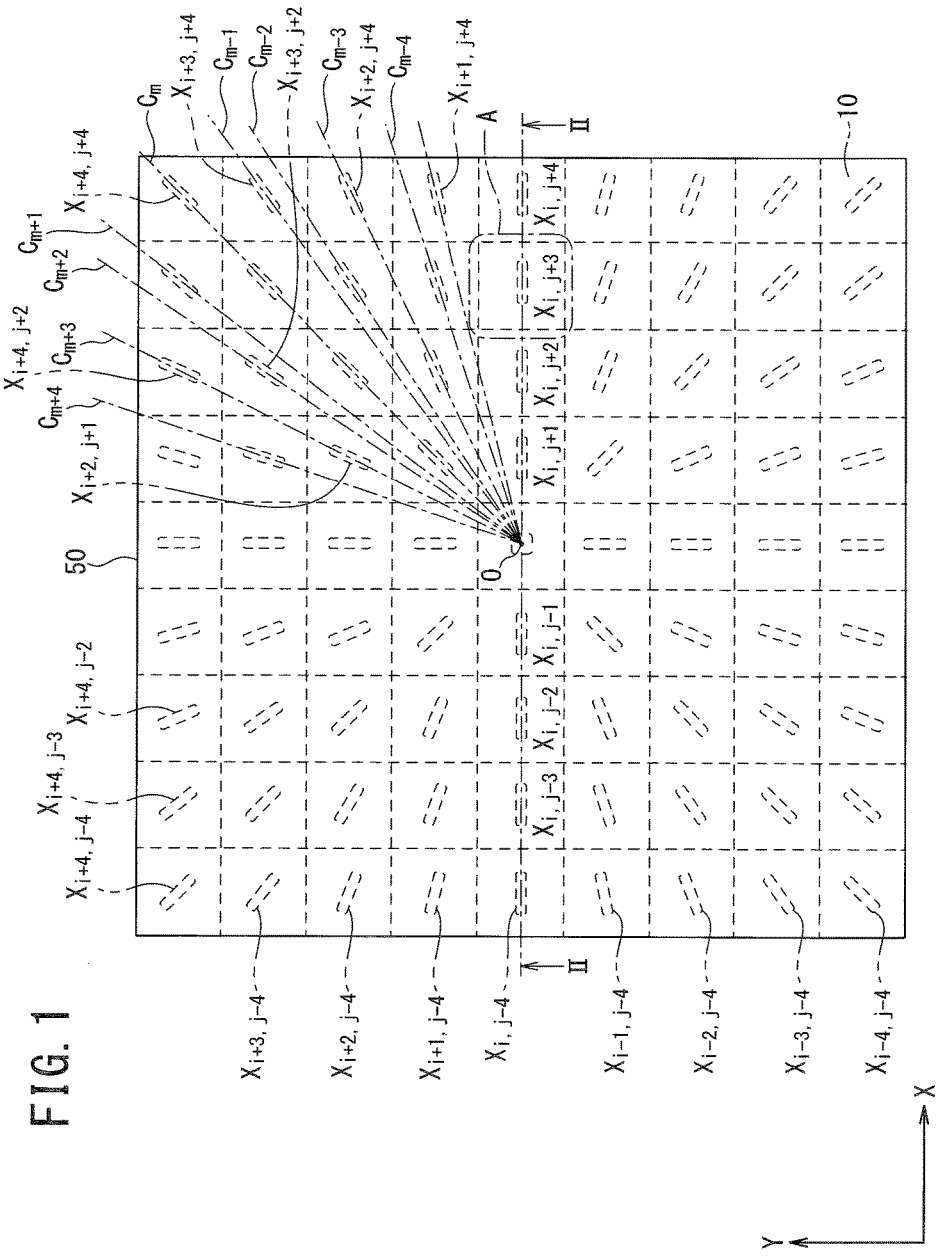
FIG. 1 is a schematic plan view illustrating a solid-state imaging device according to an embodiment of the present invention.

Exemplary embodiments of the present invention will be described below with reference to the drawings. The same or similar reference numerals are used to designate the same or similar portions throughout the drawings. Since the drawings are only schematic, a relation between a thickness and a planar dimension, and a ratio between the thicknesses of respective layers, and the like may differ from the actual values. Also, naturally, the portion in which the relation and ratio between the mutual dimensions are different is included even between the drawings. Also, because the following embodiments are mere examples of the devices and methods to embody the technical idea of the present invention, in the technical idea of the present invention, the material quality, shape, structure, arrangement and the like of a configuration part are not limited to the followings.

The terms relating to directions, such as "upper," "lower," "top," and "bottom" in the following description will be used for the purpose of explanation and will not limit the technical idea of the present invention. For example, when a target having an upper end and a lower end is rotated by 90 degree, the upper end and lower ends of the target is expressed as left and right ends of the target, respectively. When the target is rotated by 180 degree, the upper end and the lower end is changed into the lower end and the upper end, respectively.

(Solid-State Imaging Device)

Figure 2:
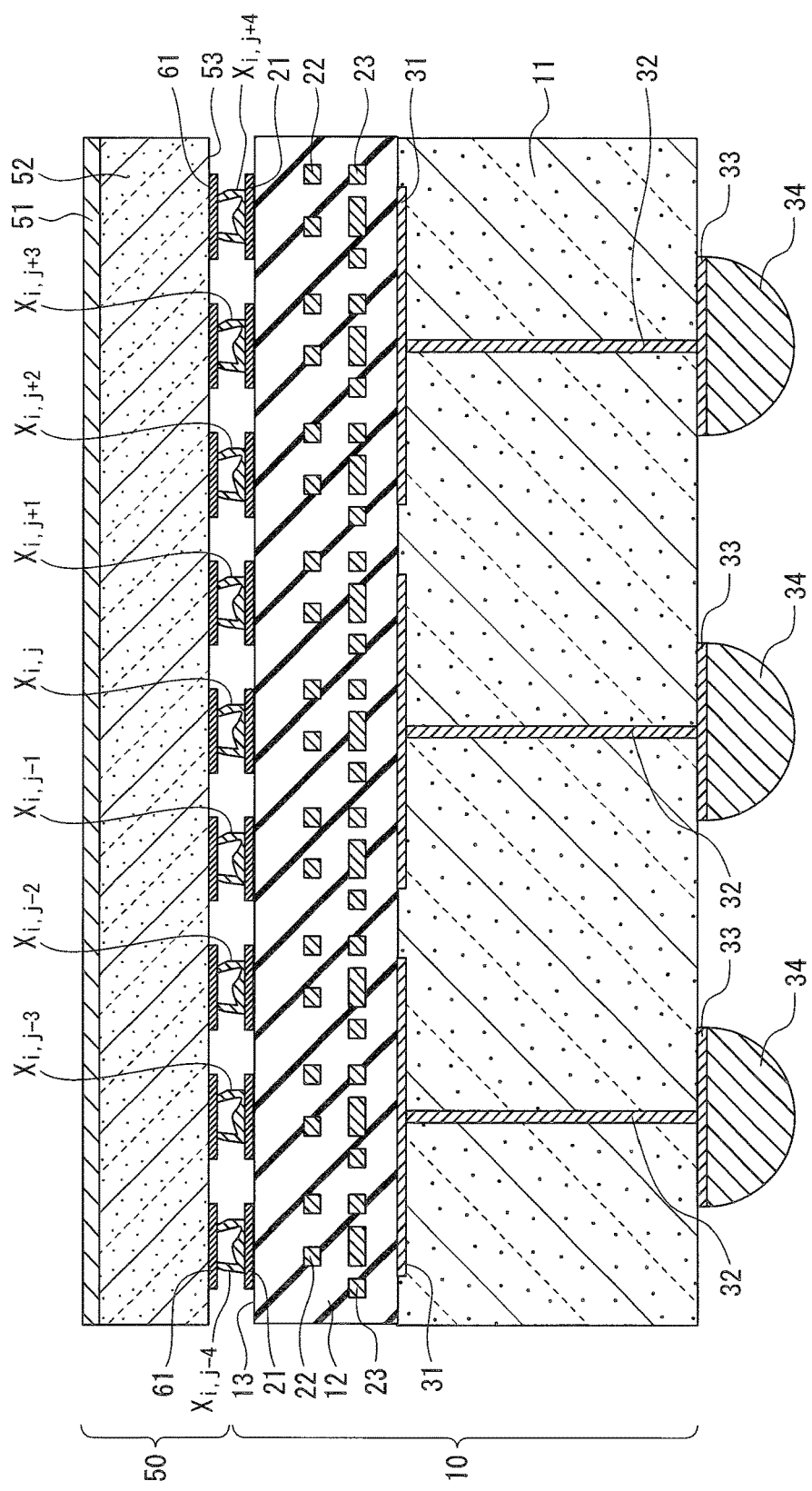
FIG. 2 is a cross-sectional view taken along arrows II-II in FIG. 1.

As illustrated in FIG. 2, a solid-state imaging device according to an embodiment of the present invention includes a detector substrate 50 and a signal-circuit substrate 10. The detector substrate 50 and the signal-circuit substrate 10 face each other to implement a laminated structure. On the detector substrate 50, solid-state detectors $P_{ij}$ are arranged in a two-dimensional m×n matrix. On the signal-circuit substrate 10, signal read-out circuits for reading signals from the solid-state detectors are arranged in a two-dimensional m×n matrix corresponding to the matrix of the detector substrate 50. The details of the solid-state detectors $P_{ij}$ will be described later with reference to FIGS. 9 and 10. The two-dimensional m×n matrix arrangement of the solid-state detectors $P_{ij}$ corresponds to arrangement of pixels of an image sensor (i.e., solid-state imaging device). The signal read-out circuits on the signal-circuit substrate 10 each includes circuits for a switching element $Q_{ij}$ and a buffer amplifier to read signals from the pixels arranged in the two-dimensional m×n matrix.

As is clear from FIG. 1, the signal-circuit substrate 10 and the detector substrate 50 have planar rectangular shapes that are congruent to each other. As illustrated in FIG. 2, a plurality of tubular bumps $X_{ij}$ (i=1 to m; j=1 to n) is provided between the signal-circuit substrate 10 and the detector substrate 50 in a two-dimensional m×n matrix corresponding to the matrix arrangement of the solid-state detectors $P_{ij}$. The solid-state detectors $P_{ij}$ in the matrix arrangement are electrically connected to the signal read-out circuits in the corresponding matrix arrangement, via the tubular bumps $X_{ij}$ independently of one another.

In the following description, each of the solid-state detectors $P_{ij}$ on the detector substrate 50 is an exemplary radiation detector which is made of a composite semiconductor, such as cadmium telluride (CdTe), zinc telluride (ZnTe), cadmium zinc telluride (CdZnTe), or gallium arsenide (GaAs). The solid-state imaging device according to the embodiment of the present invention, however, is not limited to a radiation image sensor for detecting radiological images. For example, infrared solid-state detectors $P_{ij}$, each of which is made of germanium (Ge) or semimetal such as indium antimonide (InSb) or mercury cadmium telluride (HgCdTe), may be arranged on the detector substrate 50 to implement an infrared image sensor. Thus, the solid-state imaging device according to the embodiment of the present invention may be applied to another device having electrodes arranged two-dimensionally, such as various types of image sensors. However, the solid-state imaging device according to the embodiment of the present invention has a laminated structure suitable for array of many solid-state detectors $P_{ij}$, especially in a temperature-changing environment, which creates a transient temperature history, such as low-temperature environment. For this reason, a radiation detector will be described below as an example of each of the solid-state detectors $P_{ij}$.

The detector substrate 50 has a first main-surface 53 on which one of the pair of electrodes of each of the solid-state detectors $P_{ij}$ is exposed. On the first main-surface 53, a plurality of first lands 61 is arranged in a matrix corresponding to the arrangement of the solid-state detectors $P_{ij}$. As illustrated in FIG. 2, the signal-circuit substrate 10 has a second main-surface 13 facing the first main-surface 53 in parallel. The second main-surface 13 has a center which coincides with a center of the first main-surface 53 as a plane pattern. On the second main-surface 13, a plurality of second lands 21 is arranged corresponding to the plurality of first lands 61. The signal read-out circuits for reading the signals from the solid-state detectors $P_{ij}$ are arranged in a matrix on the signal-circuit substrate 10. The second main-surface 13 has a center which coincides with a center "o" of the first main-surface 53 as a plane pattern. For example, as a plane pattern, the detector substrate 50 coincides with the signal-circuit substrate 10. The plurality of flattened-tubular bumps $X_{ij}$ is sandwiched between the plurality of second lands 21 and the plurality of first lands 61.

As illustrated in FIG. 1, the plurality of tubular bumps $X_{ij}$ is arranged such that, as a plane pattern, a central line along each of the major axes of plurality of flattened-tubular bumps $X_{ij}$ coincides with one of lines $C_{m+4}$, $C_{m+3}$, $C_{m+2}$, $C_{m+1}$, $C_m$, $C_{m-1}$, $C_{m-2}$, $C_{m-3}$, $C_{m-4}$, . . . radiating from the center "o" of the first main-surface 53 and the second main-surface 13. For example, a flattened-tubular bump $X_{i+4j+2}$ and a flattened-tubular bump $X_{i+2j+1}$ are arranged on a line $C_{m+3}$ in a longitudinal direction such that a central line along the major axes of the flattened-tubular bumps $X_{i+4j+2}$ and $X_{i+2j+1}$ coincides with the line $C_{m+3}$. A flattened-tubular bump $X_{i+3j+2}$ is arranged on a line $C_{m+2}$ such that a central line of the flattened-tubular bumps $X_{i+3j+2}$ in a longitudinal direction coincides with the line $C_{m+2}$.

Although the signal-circuit substrate 10 and the detector substrate 50 both having a square shape with 9×9 pixels are illustrated in FIG. 1 for the purpose of illustration, the actual number of pixels is represented as m×n in a two-dimensional matrix. Actual two-dimensional radiation detectors have several hundred pixels to several thousand pixels in each of the two axis directions (i.e., X axis direction and Y axis direction). Thus, the plurality of second lands 21, the plurality of first lands 61 and the plurality of flattened-tubular bumps $X_{ij}$ are arranged in a matrix with several hundred pixels to several thousand pixels in each of the two axis directions. The pixel pitch is defined to be equal to or more than eight micro meters and less than 50 micro meters, for example.

If m=n=2p+1 (odd number) is satisfied, there is a flattened-tubular bump $X_{ij}$ located at the center "o" as a plane pattern. Since, in general, the number of pixels in each of the two directions is even number (m=n=2p), all of the flattened-tubular bumps $X_{ij}$ are actually arranged such that, as a plane pattern, a central line of each of the flattened-tubular bumps $X_{ij}$ in a longitudinal direction coincides with one of lines $C_{m+4}$, $C_{m+3}$, $C_{m+2}$, $C_{m+1}$, $C_m$, $C_{m-1}$, $C_{m-2}$, $C_{m-3}$, $C_{m-4}$, . . . radiating from the center "o". The plurality of second lands 21, the plurality of first lands 61 and the plurality of flattened-tubular bumps $X_{ij}$ are arranged in a two-dimensional matrix corresponding to the pixels of the radiological image.

Figure 9:
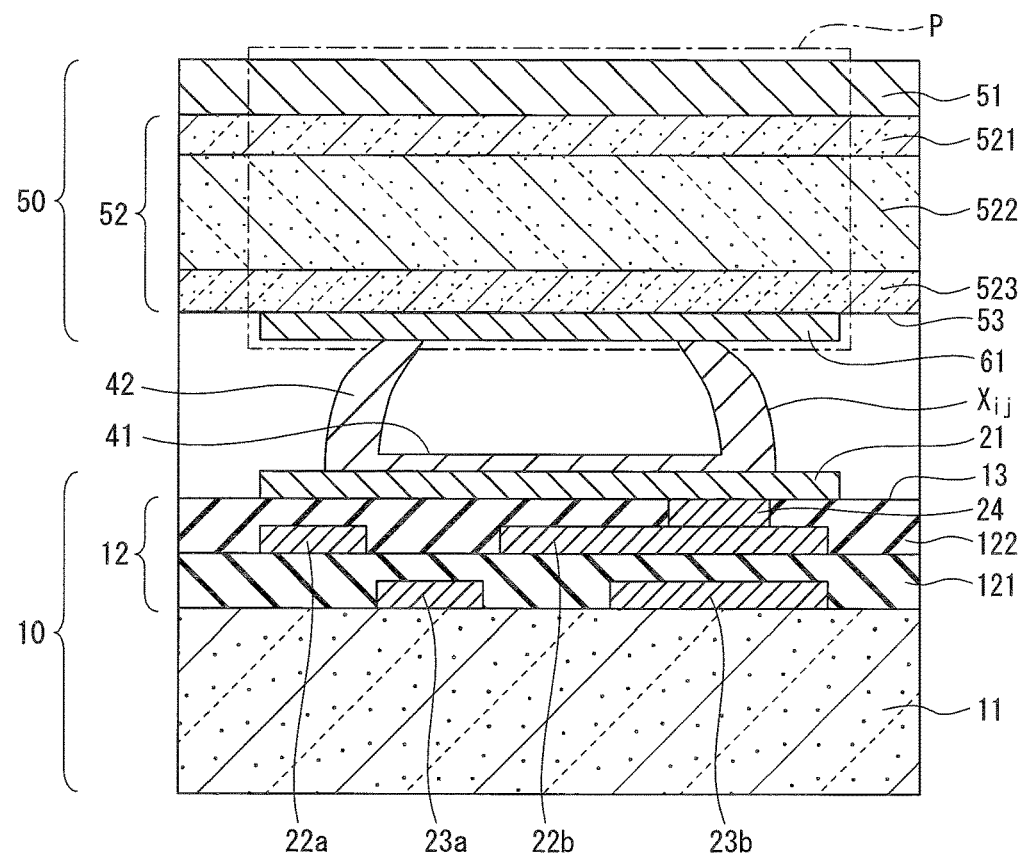
FIG. 9 is an enlarged cross-sectional view illustrating in detail a structure of one pixel of the solid-state imaging device according to the embodiment of the present invention.

The detector substrate 50 further includes an array chip 52 and a common-electrode layer 51 as illustrated in FIG. 2. The solid-state detectors $P_{ij}$ are arranged in a two-dimensional m×n matrix on the array chip 52. The common-electrode layer 51 is connected to a top face of the array chip 52. As illustrated in FIG. 9, each of the solid-state detectors $P_{ij}$ includes a first carrier-block layer 521 forming the top face of the array chip 52, a second carrier-block layer 523 forming a bottom face of the array chip 52, and a carrier-generation layer 522 sandwiched between the first carrier-block layer 521 and the second carrier-block layer 523 and made of an intrinsic semiconductor. The first carrier-block layer 521 and the second carrier-block layer 523 are an n-type or p-type semiconductor whose impurity concentration is higher than that of the carrier-generation layer 522. Hence, each of the solid-state detectors $P_{ij}$ has an n-i-n diode structure or a p-i-p diode structure. Each of the solid-state detectors $P_{ij}$ is represented as a parallel circuit in which a variable resistance $R_{ij}$ whose resistance value is based on an amount of radiation and a parasitic capacity $C_{sij}$ are connected by parallel connection, as shown in an equivalent circuit illustrated in FIG. 10.

The carrier-generation layer 522 generates carriers ascribable to electron-hole pairs, after receiving radiation through the common-electrode layer 51. For example, when a negative bias voltage Vb is applied to the common-electrode layer 51, the carriers generated in the carrier-generation layer 522 are read out from the first lands 61.

The first carrier-block layer 521 blocks first carriers from flowing into the carrier-generation layer 522. The second carrier-block layer 523 blocks second carriers from flowing into the carrier-generation layer 522. The first carrier indicates one of an electron and a hole, and the second carrier indicates the other of the electron and the hole. For example, when the negative bias voltage Vb is applied to the common-electrode layer 51, the first carrier-block layer 521 blocks injection of electrons into the carrier-generation layer 522 while the second carrier-block layer 523 blocks injection of holes into the carrier-generation layer 522. On the other hand, when a positive bias voltage Vb is applied to the common-electrode layer 51, the first carrier-block layer 521 blocks injection of holes into the carrier-generation layer 522 while the second carrier-block layer 523 blocks injection of electrons into the carrier-generation layer 522.

As illustrated in FIG. 9, a single first land 61 and a part a portion including the array chip 52 and the common-electrode layer 51, the portion corresponding to a limited region above the single first land 61, implement a single solid-state detector $P_{ij}$. As a detecting element for a single pixel, the single solid-state detector $P_{ij}$ transmits a signal, in accordance with an amount of radiation received. The detector substrate 50 has a bottom face of the array chip 52 as the first main-surface 53.

The plurality of first lands 61 is arranged two-dimensionally on the bottom face of the array chip 52, separately from one another. When a bias voltage is applied to the common-electrode layer 51, the carriers are generated in the array chip 52, and the signals, which are represented by carriers, are read out from the plurality of first lands 61. Thus, the detector substrate 50 functions as a detecting substrate for detecting radiation, and the first land 61 functions as a detecting electrode of the solid-state detector $P_{ij}$ for detecting a carrier signal for each pixel.

The signal-circuit substrate 10 further includes a support base 11 made of a semiconductor substrate, and a circuit-merged insulating-layer 12 disposed on the support base 11. The circuit-merged insulating-layer 12 has intermediate-level interconnections 22 and lower-level interconnections 23, separately from one another, so as to provide a thin-film integrated circuit. The thin-film integrated circuit implements each of the signal read-out circuits for each pixel. Although the circuit-merged insulating-layer 12 is illustrated in FIG. 2 as if it was a single layer film, the actual circuit-merged insulating-layer 12 is a multilevel insulating layer made of triple or higher level architectures.

Figure 10:
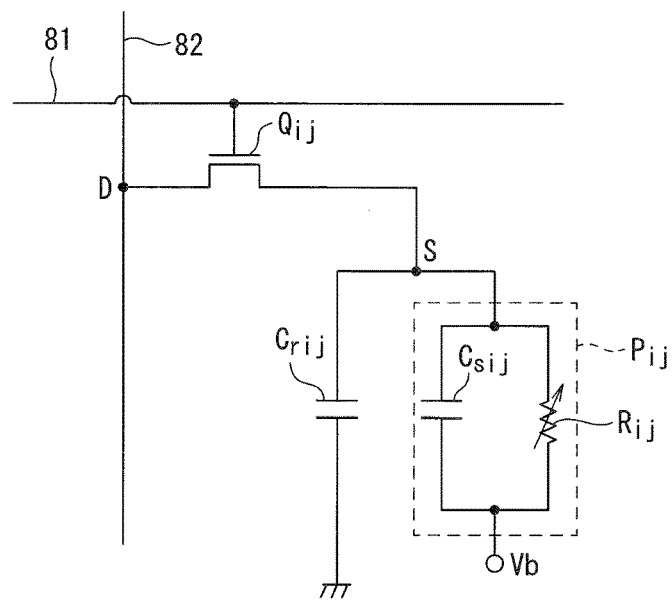
FIG. 10 is a schematic view of an equivalent circuit of one pixel of the solid-state imaging device according to the embodiment of the present invention.

A schematic view of the signal-circuit substrate 10 is illustrated in FIG. 2. In the actual signal-circuit substrate 10, a silicon (Si) substrate may be employed as the support base 11, and circuits each having a combination of a read-out capacitor $C_{rij}$ and the switching element $Q_{ij}$ for each pixel as illustrated in FIG. 10 may be integrated on top of the support base 11. If the integrated circuit is provided on a surface of the silicon substrate, the circuit-merged insulating-layer 12 functions as a multilevel interconnection layer on the surface. Alternatively, the read-out capacitor $C_{rij}$ and the switching element $Q_{ij}$ made of a thin-film transistor may be provided inside the circuit-merged insulating-layer 12 by use of the intermediate-level interconnections 22 and the lower-level interconnections 23 via an inter-layer insulating film. Alternatively, the structure shown in FIG. 2 may be changed such that a circuit close to the lower-level interconnections 23 in the circuit-merged insulating-layer 12 shown in FIG. 2 corresponds to the integrated circuit on the surface of the silicon substrate, and the intermediate-level interconnections 22 in the circuit-merged insulating-layer 12 corresponds to a surface interconnection layer in the inter-layer insulating film.

The signal read-out circuit for each pixel is connected to the first land 61 via the flattened-tubular bump $X_{ij}$ and the second land 21 if the signal read-out circuit is made of the integrated circuit on the surface of the silicon substrate or made of the intermediate-level interconnections 22 and the lower-level interconnections 23, or even if another structure is employed. With this configuration, the signal from the detector substrate 50 is transmitted to the signal read-out circuit via the first land 61. Thus, the signal-circuit substrate 10 functions as a read-out substrate in which the plurality of signal read-out circuits for reading the signals from the detector substrate 50 is arranged in a matrix in accordance with the pixel arrangement. The plurality of second lands 21 functions as read-out electrodes for reading the signals from the plurality of first lands 61 for each of the pixels.

Suppose that the signal read-out circuits are made of thin-film circuits by use of the intermediate-level interconnections 22 and the lower-level interconnections 23, the signal-circuit substrate 10 includes, as illustrated in FIG. 2, a plurality of first interconnection layers 31 arranged on a top face of the support base 11, a plurality of through holes 32 that goes through the support base 11 between the top and bottom faces, and a plurality of second interconnection layers 33 arranged on the bottom face of the support base 11. Each of the first interconnection layers 31 is electrically connected to a part of the lower-level interconnections 23. The first interconnection layer 31 and the second interconnection layer 33 are electrically connected to each other via the through hole 32. On bottom faces of the second interconnection layers 33, solder bumps 34 are provided for connection with external circuits.

Figure 3:
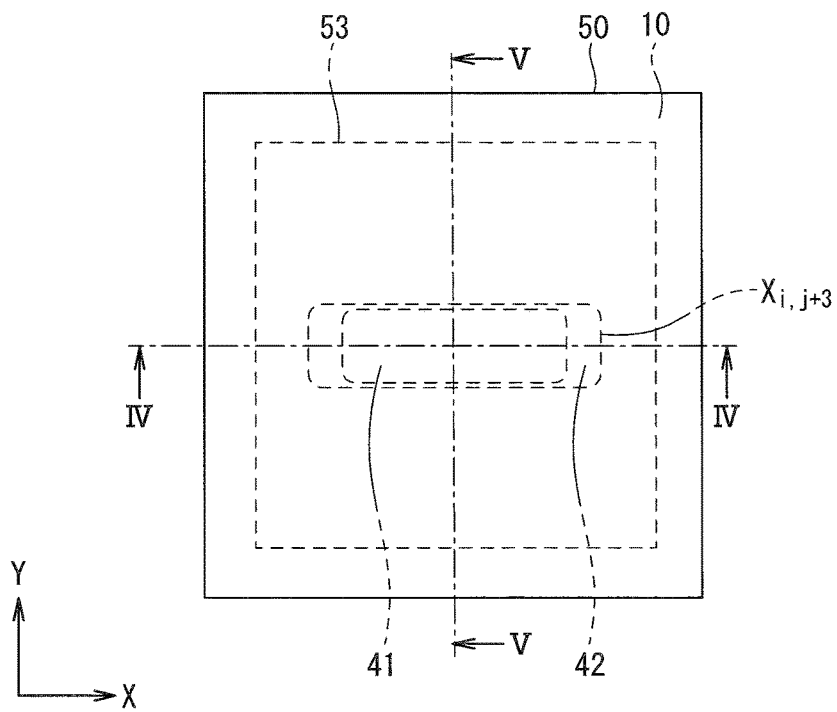
FIG. 3 is an enlarged plan view illustrating an A portion in FIG. 1.

FIG. 3 is an enlarged plan view of a dot-dashed line portion in FIG. 1, which encircles the flattened-tubular bump $X_{i,j+3}$, the dot-dashed line portion is labeled by "A" as illustrated in FIG. 1. As illustrated in FIG. 3, the flattened-tubular bump $X_{i,j+3}$ is, as a plane pattern, a long rounded-rectangular (curbed-rectangular) in shape whose major axis along longitudinal direction is directed to toward the center "o" of the first main-surface 53 and the second main-surface 13, for example. That is, the flattened-tubular bump $X_{i,j+3}$ is oriented such that, as a plane pattern, the longitudinal direction is aligned with the radial line passing through the center "o". Also, the flattened-tubular bumps $X_{i,j+4}$, $X_{i,j+2}$, $X_{i,j+1}$, $X_{i,j-1}$, $X_{i,j-2}$, . . . other than the focused flattened-tubular bump $X_{i,j+3}$ are oriented such that, as a plane pattern, the longitudinal direction is aligned with the radial line passing through the center "o". Each of the first lands 61 is square in shape, for example.

Figure 4:
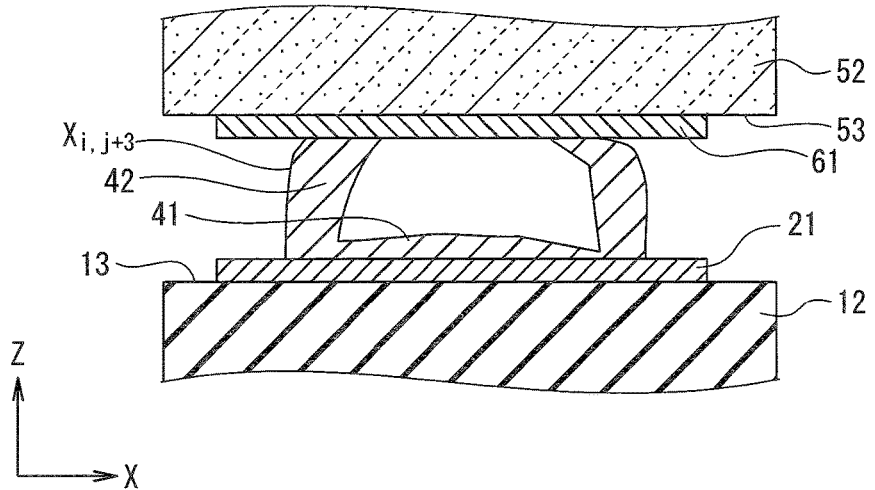
FIG. 4 is an enlarged cross-sectional view taken along arrows IV-IV in FIG. 3.
Figure 5:
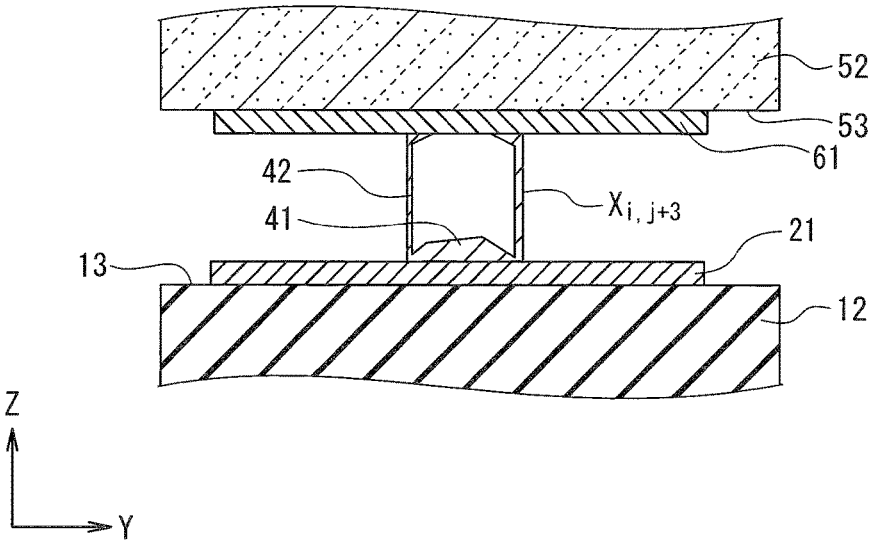
FIG. 5 is an enlarged cross-sectional view taken along arrows V-V in FIG. 3.

The flattened-tubular bump $X_{i,j+3}$ will be focused on again. As illustrated in FIGS. 4 and 5, the flattened-tubular bump $X_{i,j+3}$ includes a bottom 41 that is the long rounded-rectangular in shape as a plane pattern, and includes a side wall 42 that is connected to an outer periphery of the bottom 41 to provide a wall surrounding the bottom 41. The side wall 42 is tubular, having a lower end connected to the top face of the second land 21 and having an upper end connected to the bottom face of the first land 61. The thickness of the side wall 42 along the longitudinal direction of the flattened-tubular bump $X_{i,j+3}$ is smaller than the thickness of the side wall 42 along a short direction orthogonal to the longitudinal direction. The side wall 42 has an inverse tapered shape in which inner and outer peripheries decrease toward the upper end from the lower end. The upper end of the side wall 42 is pressed from the first land 61 so as to deform inward, and the side wall 42 connects to the bottom face of the first land 61.

Each of the flattened-tubular bumps $X_{i,j+4}$, $X_{i,j+2}$, $X_{i,j+1}$, $X_{i,j-1}$, $X_{i,j-2}$, ... other than the focused flattened-tubular bump $X_{i,j+3}$ shares the same structure as that of the flattened-tubular bump $X_{i,j+3}$. In the following, the flattened-tubular bump $X_{ij}$ is treated as a representative of the plurality of flattened-tubular bumps $X_{ij}$. The plurality of flattened-tubular bumps $X_{ij}$ is made of gold (Au) or gold-alloy such as Au—Si, Au—Ge, Au—Sb, Au—Sn, Au—Pb, Au—Zn, or Au—Cu, each of the alloy containing 80% or more of Au weight percent based on total alloy weight. For this reason, the plurality of flattened-tubular bumps $X_{ij}$ has degree of hardness that allows them to easily deform at the time of connection.

The height of each flattened-tubular bump $X_{ij}$ is defined to be equal to or more than one micro meter and less than five micro meters, for example. Although the outer length of the flattened-tubular bump $X_{ij}$ in the short direction is defined to be equal to or more than one micro meter and less than five micro meters, for example, the outer length is preferably equal to or more than the height of the flattened-tubular bump $X_{ij}$. The outer length of the flattened-tubular bump $X_{ij}$ in the longitudinal direction is defined to be equal to or more than the outer length in the short direction and less than a side of the first land, for example. The plurality of flattened-tubular bumps $X_{ij}$ shares the same size, for example.

Figure 6:
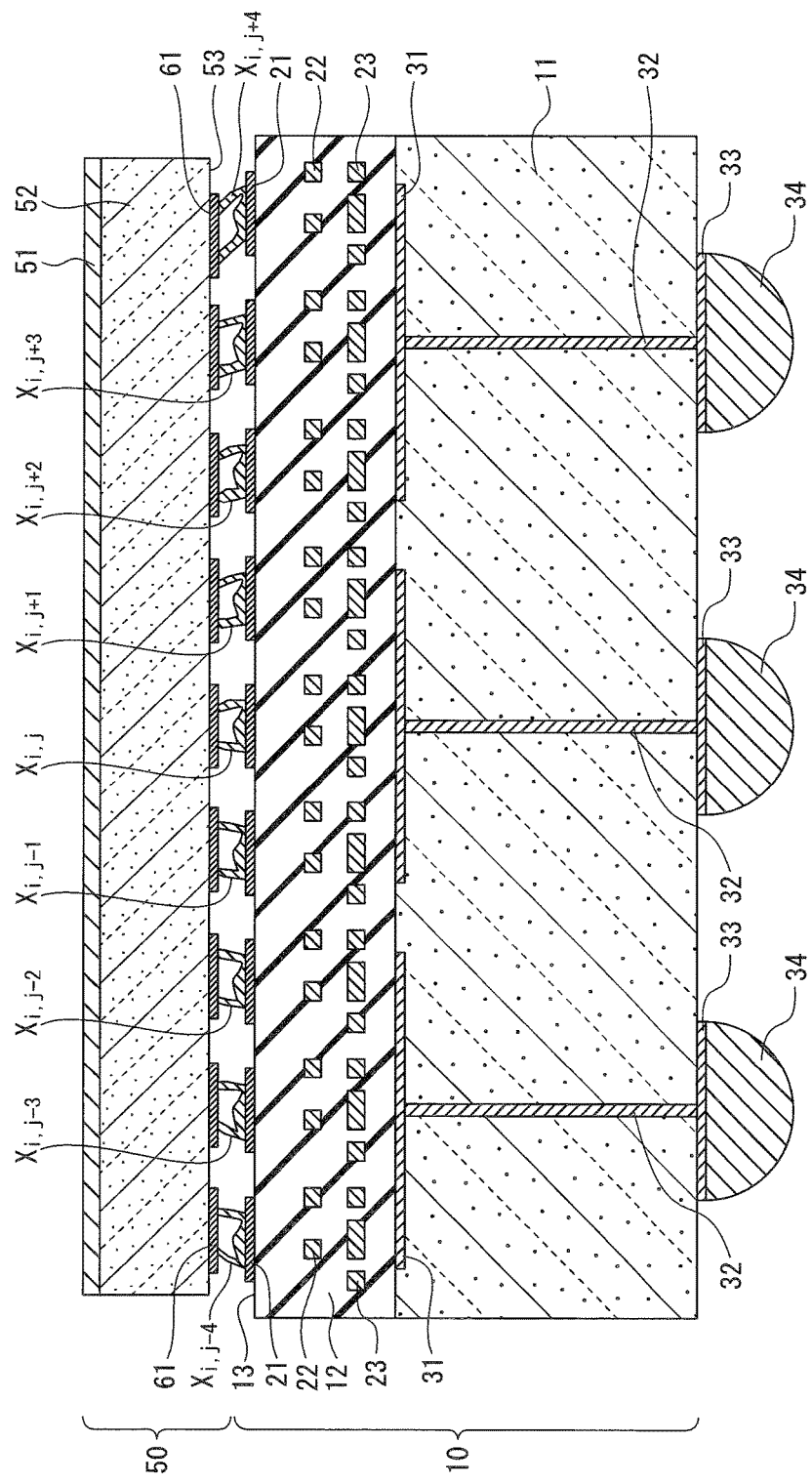
FIG. 6 is a cross-sectional view of the solid-state imaging device when the solid-state imaging device is cooled.
Figure 7:
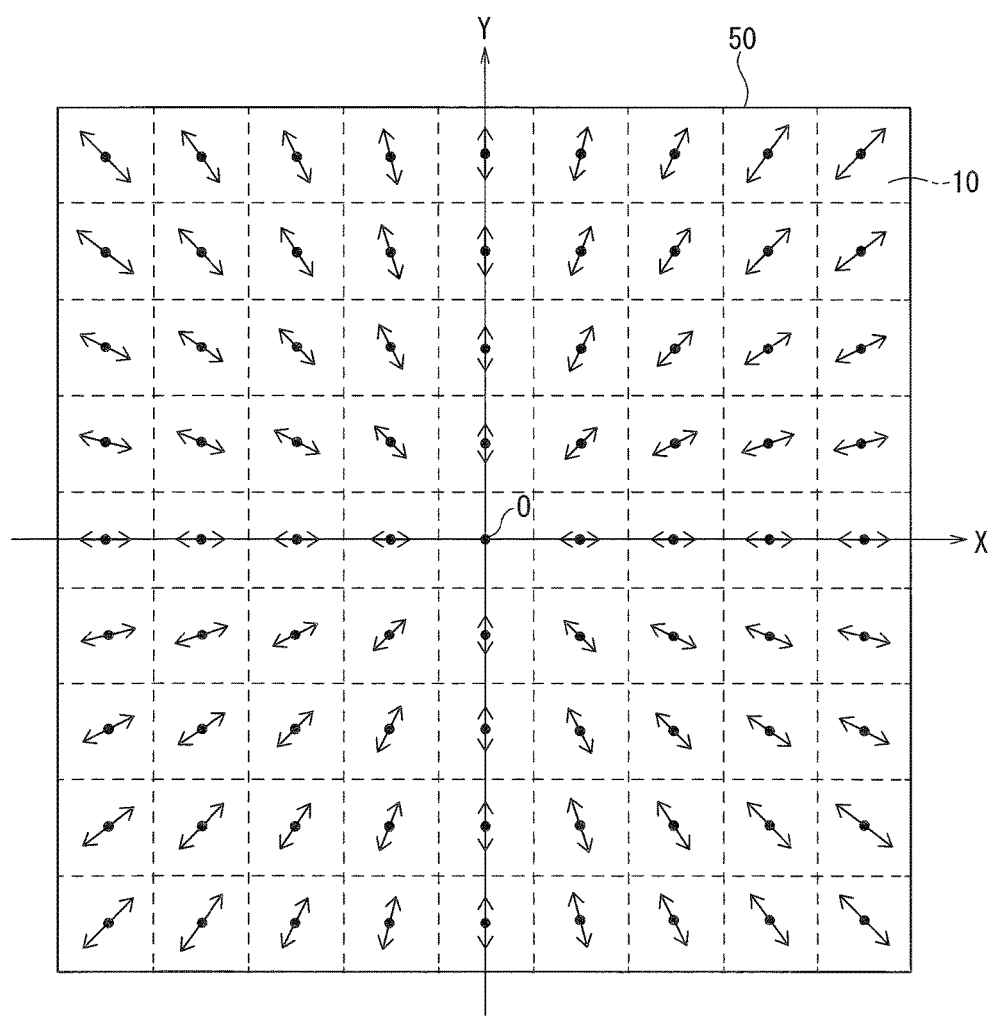
FIG. 7 is a schematic view illustrating thermal stress on tubular bumps of the solid-state imaging device according to the embodiment of the present invention.

Under the condition that coefficient of thermal expansion of the detector substrate 50 is larger than that of the signal-circuit substrate 10, for example, when a laminated structure (stacked device) implementing the solid-state imaging device of the embodiment is cooled, the detector substrate 50 contracts at a higher rate than the signal-circuit substrate 10 as illustrated in FIG. 6. As illustrated in FIG. 7, shear stress in a horizontal direction (X-Y plane direction), i.e., thermal stress on the flattened-tubular bumps $X_{ij}$ occurs along the radial lines passing through the center "o" of the first main-surface 53, and increases with distance from the center "o", as a plane pattern. In FIG. 7, solid circles indicate positions of the flattened-tubular bumps $X_{ij}$, and arrows indicate magnitude and direction of the thermal stress on the flattened-tubular bumps $X_{ij}$.

If the coefficient of thermal expansion of the signal-circuit substrate 10 is denoted by $C_A$, and the coefficient of thermal expansion of the detector substrate 50 is denoted by $C_B$, then the shear stress $S_S$ in the horizontal direction on the flattened-tubular bump $X_{ij}$ located at a distance L from the center "o" is given by Eq. (1):

$$S_S \propto (C_A - C_B) \times L \times \Delta T \quad (1)$$

Figure 8:
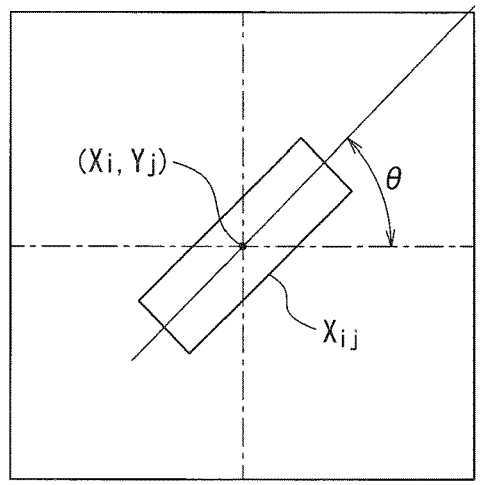
FIG. 8 is a schematic view illustrating orientation of the tubular bumps of the solid-state imaging device according to the embodiment of the present invention.

In FIG. 7, array directions of the pixels are prescribed with respect to X axis and Y axis, by defining the coordinates of the center "o" as the origin, such that the coordinates of the origin are $(X_0, Y_0)$ and the coordinates of each pixel are $(X_i, Y_j)$. Then, an inclined angle θ between the X axis direction and the longitudinal direction of each flattened-tubular bump $X_{ij}$ is given by Eq. (2), as illustrated in FIG. 8:

$$\theta = \tan^{-1}\{(Y_j - Y_0)/(X_i - X_0)\} \quad (2)$$

When the longitudinal direction, or the major-axis direction of each flattened-tubular bump $X_{ij}$ satisfies the Eq. (2), the major-axis direction of each flattened-tubular bump $X_{ij}$ coincides with the direction of the thermal stress. Since the thickness of the side wall 42 along the major-axis direction is smaller than the thickness of the side wall 42 along the minor-axis direction, or the shorter direction, the side wall 42 along the major-axis direction is easier to deform than the side wall 42 along the minor-axis direction. Hence, even when the thermal stress occurs in the major-axis directions of the plurality of flattened-tubular bumps $X_{ij}$, it is possible to reduce the thermal stress because the side wall 42 along the major-axis direction deforms easily. Even when the thin side wall 42 along the major-axis direction of each of the plurality of flattened-tubular bumps $X_{ij}$ is broken due to too much thermal stress, the connection between the second land 21 and the first land 61 can be maintained because of the thick side wall 42 along the minor-axis direction. It is therefore possible for the flattened-tubular bump $X_{ij}$ to maintain the electrical connection between the second land 21 and the first land 61.

Although the signal-circuit substrate 10 and the detector substrate 50 both having a square shape with 9×9 pixels are illustrated in FIG. 1 for the purpose of illustration, the actual number of pixels of the solid-state imaging device according to the embodiment of the present invention is m×n. If m=n=2p+1 (odd number) is satisfied, a flattened-tubular bump $X_{ij}$ located at the center "o" as a plane pattern is present. Since, in general, the number of pixels in each of the two directions is even number (m=n=2p), all of the flattened-tubular bumps $X_{ij}$ are actually arranged such that, as a plane pattern, a central line of each of the flattened-tubular bumps $X_{ij}$ in a major-axis direction coincides with one of the lines $C_{m+3}$, $C_{m+2}$, $C_{m+1}$, $C_m$, $C_{m-1}$, $C_{m-2}$, $C_{m-3}$, $C_{m-4}$, ... radiating from the center "o". However, in FIG. 1, the thermal stress on the tubular bump $X_{ij}$ located at the center "o" is zero in theory. For this reason, the major-axis direction of the tubular bump $X_{ij}$ located at the center "o" cannot be defined. And therefore, the shape of the tubular bump located at the center "o" is a rounded-square having four equal sides, as a plane pattern. Of course, the tubular bump located at the center "o" may share the same flat shape with the other flattened-tubular bumps $X_{ij}$, and the inclined angle θ between the X axis direction and the major-axis direction may be arbitrarily defined.

Each of the second land 21 and the first land 61 may be made of, for example, Au or alloy such as Au—Si, Au—Ge, Au—Sb, Au—Sn, Au—Pb, Au—Zn, or Au—Cu, each of the alloy containing 80% or more of Au weight percent based on total alloy weight, and a metal layer such as a Nickel (Ni) layer may be employed as a base-layer to provide a multi-level structure. With this structure, it is possible for each of the second land 21 and the first land 61 to reduce a contact resistance with the tubular bump $X_{ij}$.

As illustrated in FIG. 9, the signal-circuit substrate 10 includes a first lower-level interconnection 23a, a second lower-level interconnection 23b, a first circuit-merged insulating-layer 121, a first intermediate-level interconnection 22a, a second intermediate-level interconnection 22b, and a second circuit-merged insulating-layer 122. The first lower-level interconnection 23a and the second lower-level interconnection 23b are disposed separately from each other on a top face of the support base 11. The first circuit-merged insulating-layer 121 covers the first lower-level interconnection 23a and the second lower-level interconnection 23b so as to bury the first lower-level interconnection 23a and the second lower-level interconnection 23b. The first intermediate-level interconnection 22a and the second intermediate-level interconnection 22b are disposed separately from each other on the first circuit-merged insulating-layer 121. The second circuit-merged insulating-layer 122 covers the first intermediate-level interconnection 22a and the second intermediate-level interconnection 22b so as to bury the first intermediate-level interconnection 22a and the second intermediate-level interconnection 22b.

The first lower-level interconnection 23a and the second lower-level interconnection 23b correspond to the lower-level interconnection 23 illustrated in FIG. 2. Similarly, the first intermediate-level interconnection 22a and the second intermediate-level interconnection 22b correspond to the intermediate-level interconnection 22. Each of the intermediate-level interconnection 22 and the lower-level interconnection 23 is made of a metal layer, such as aluminum (Al), aluminum-copper (Al—Cu) alloy, or copper (Cu) damascene.

The first circuit-merged insulating-layer 121 and the second circuit-merged insulating-layer 122 correspond to the circuit-merged insulating-layer 12 illustrated in FIG. 2. For the circuit-merged insulating-layer 12, for example, it is possible to employ an inorganic-based insulating layer such as silicon dioxide film ($SiO_2$ film), silicon nitride film ($Si_3N_4$ film), phosphorous silicate glass film (PSG film), fluorine doped oxide film (SiOF film), or carbon doped oxide film (SiOC film), and an organic-based insulating film such as hydrogenated silicon oxy-carbide (SiCOH), siloxane-based hydrogen silsesquioxane (HSQ), porous methyl silsesquioxane film, or polyallylene film. It is also possible to combine and laminate those various films to provide the circuit-merged insulating-layer 12 with various multilevel structures.

A part of the second intermediate-level interconnection 22b faces the second lower-level interconnection 23b via the first circuit-merged insulating-layer 121. The second intermediate-level interconnection 22b is electrically connected to the second land 21 via a conductor 24. The second lower-level interconnection 23b is connected to a ground potential. With the structure illustrated in FIG. 9, the second intermediate-level interconnection 22b and the second lower-level interconnection 23b implement the read-out capacitor $C_{rij}$ that is a thin film capacitor for storing signal charges generated in the solid-state detector $P_{ij}$ as illustrated in FIG. 10.

Inside the circuit-merged insulating-layer 12, a channel region is provided (not illustrated in the drawings) to have a channel between the first intermediate-level interconnection 22a and the second intermediate-level interconnection 22b when voltage is applied to the first lower-level interconnection 23a. With the structure illustrated in FIG. 9, the first lower-level interconnection 23a, the first intermediate-level interconnection 22a and the second intermediate-level interconnection 22b implement the switching element $Q_{ij}$ that is the thin film transistor for reading the signal charges stored in the read-out capacitor $C_{rij}$. The first lower-level interconnection 23a, the first intermediate-level interconnection 22a and the second intermediate-level interconnection 22b function as a gate electrode G, a drain electrode D, and a source electrode S, respectively.

As illustrated in FIG. 10, the gate electrode G of the switching element $Q_{ij}$, i.e., the first lower-level interconnection 23a is connected to a gate signal line 81 extending in a row direction (X axis direction) of the pixels. The gate signal lines 81 are arranged for each row of the pixels, and each of the gate signal lines 81 is connected to each of the gate electrodes G on the same row. Each of the gate signal lines 81 is connected to a gate drive circuit (not illustrated in the drawings), and gate drive signals are sequentially supplied from the gate drive circuit to each of the gate signal lines 81. The gate drive signals are sequentially supplied in a column direction in a specified scan period.

The drain electrode D of the switching element $Q_{ij}$, i.e., the first intermediate-level interconnection 22a is connected to a signal read-out line 82 extending in the column direction of the pixels. The signal read-out lines 82 are arranged for each column of the pixels, and each of the signal read-out lines 82 is connected to each of the drain electrodes D on the same column. Each of the signal read-out lines 82 is connected to a read-out drive-circuit (not illustrated in the drawings) to sequentially scan in the row direction (X axis direction) by the read-out drive-circuit. In this way, the read-out drive-circuit is configured to sequentially read out, in the column direction, the signals of the pixels on the column after the gate drive signals are supplied, in each scan period of the gate drive circuit.

The signals of the pixels read out in this way are converted into the respective pixel values by an image processing circuit (not illustrated in the drawings), and mapping of the respective pixel values is performed, corresponding to each position of the pixels, to generate a radiological image indicating a two-dimensional distribution of amount of radiation.

(Method for Manufacturing Tubular Bump)

A method for manufacturing the tubular bump $X_{ij}$ of the solid-state imaging device according to the embodiment of the present invention will be described with reference to FIGS. 11 to 19. Although, in FIGS. 11 to 19, enlarged views of the single tubular bump $X_{ij}$ are illustrated, the plurality of tubular bumps $X_{ij}$ is actually disposed collectively on the top faces of the plurality of second lands 21 as illustrated in FIG. 2. Although, in the cross-sectional views of FIGS. 12, 13, 15, 16, 18 and 19, the intermediate-level interconnections 22 and the lower-level interconnections 23 are not shown for simplicity, the actual intermediate-level interconnections 22 and lower-level interconnections 23 are buried in advance in the circuit-merged insulating-layer 12 as illustrated in FIG. 2.

First, a bump-layout software-program according to the embodiment is stored in a memory unit of a computer aided design (CAD) system, based on algorithm depending on Eq. (2). In accordance with the stored bump-layout software-program, the inclined angle θ between the X axis direction and the major-axis direction of each flattened-tubular bump $X_{ij}$ is defined at each position on the matrix, and a set of exposure data is created.

Next, the set of exposure data is stored in a memory unit of a mask manufacturing instrument such as a pattern generator. Using the mask manufacturing instrument, an image in which different opening patterns depending on positions like a layout illustrated in FIG. 1 are arranged in a matrix is transferred onto a photoresist film coated on a light-shielding film of a photomask substrate, such as chromic oxide film or chromium film. Using the photoresist film, the light-shielding film of the photomask substrate is etched to create a photomask for the bump layout according to the embodiment.

Figure 11:
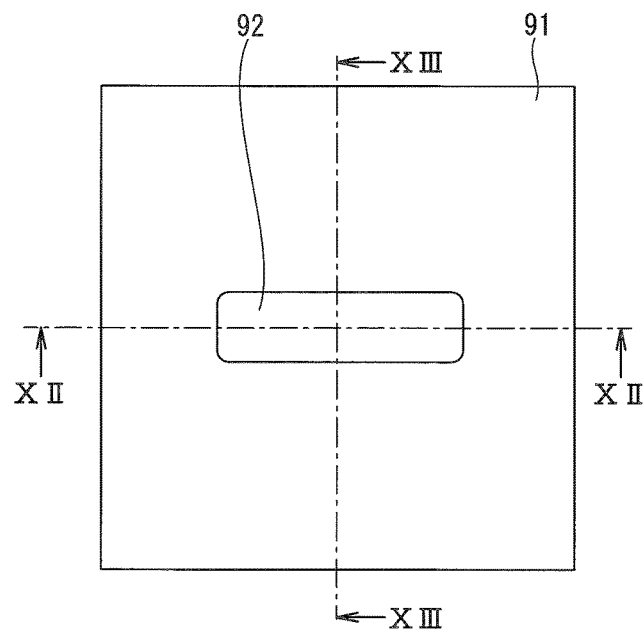
FIG. 11 is an enlarged plan view illustrating a step of a method of manufacturing the tubular bumps of the solid-state imaging device according to the embodiment of the present invention.
Figure 12:
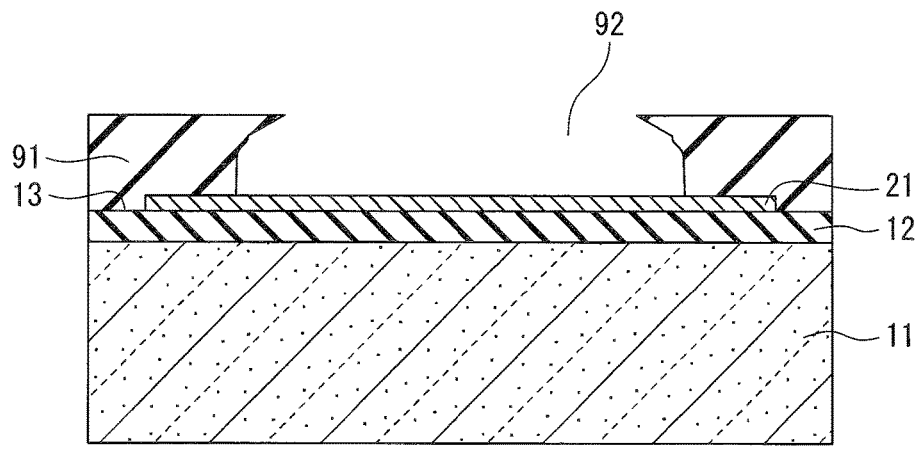
FIG. 12 is an enlarged cross-sectional view taken along arrows XII-XII in FIG. 11.
Figure 13:
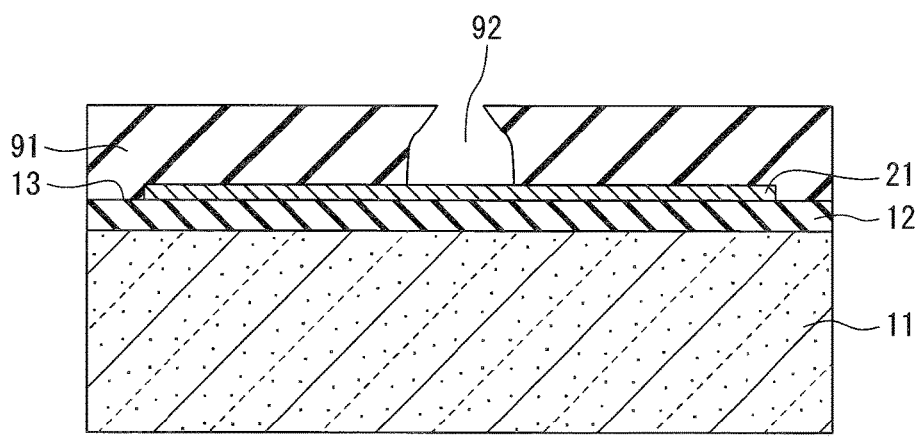
FIG. 13 is an enlarged cross-sectional view taken along arrows XIII-XIIII in FIG. 11.

Subsequently, by spin coating, the photoresist film 91 is coated on the second main-surface 13 on which the plurality of second lands 21 is arranged in advance, as illustrated in FIGS. 11, 12 and 13. The photoresist film 91 is coated such that the thickness of the photoresist film 91 coincides with the height of the tubular bump $X_{ij}$ to be manufactured.

Moreover, by photolithographic technique, patterns for a plurality of openings 92 are delineated in a matrix like a layout illustrated in FIG. 1, using the photomask for the bump layout according to the embodiment. A part of the top face of each of the second lands 21 is exposed on each of the openings 92. Each of the plurality of openings 92 has the inclined angle θ of a central line passing through the openings 92 toward the center "o", the inclined angle θ is measured between the X axis direction and the longitudinal direction of the central line, and a length of the openings 92 in the major-axis direction. The inclined angle θ and the length are defined for each of the positions of the openings 92 on the matrix, on which the lay-out of the tubular bumps $X_{ij}$ is delineated.

As illustrated in FIGS. 12 and 13, the opening 92 has an inverse tapered shape in which an inner periphery decreases toward the top face from the bottom face of the photoresist film 91. The opening 92 has an inner face whose upper portion can be curved inward such that the inner periphery is minimum at an upper end of the opening 92. Thus, the condition of the photolithography, such as development, exposure and material of the photoresist, is defined so as to provide the opening 92 with the inverse tapered shape.

Figure 14:
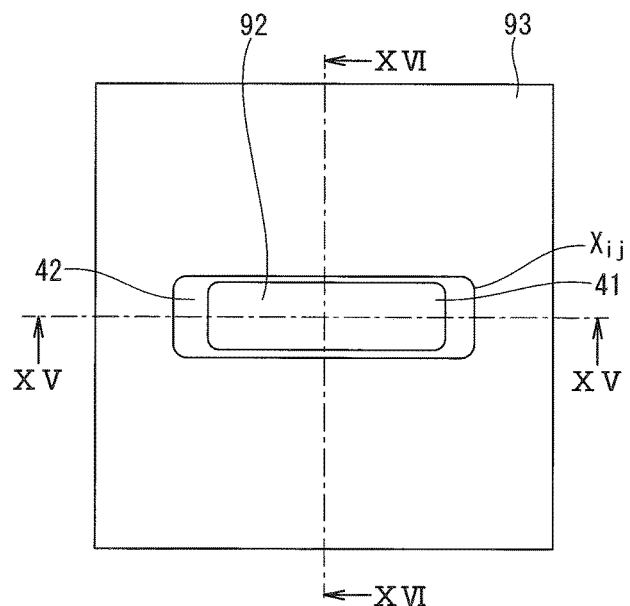
FIG. 14 is an enlarged plan view illustrating a step subsequent to the step illustrated in FIG. 11.
Figure 15:
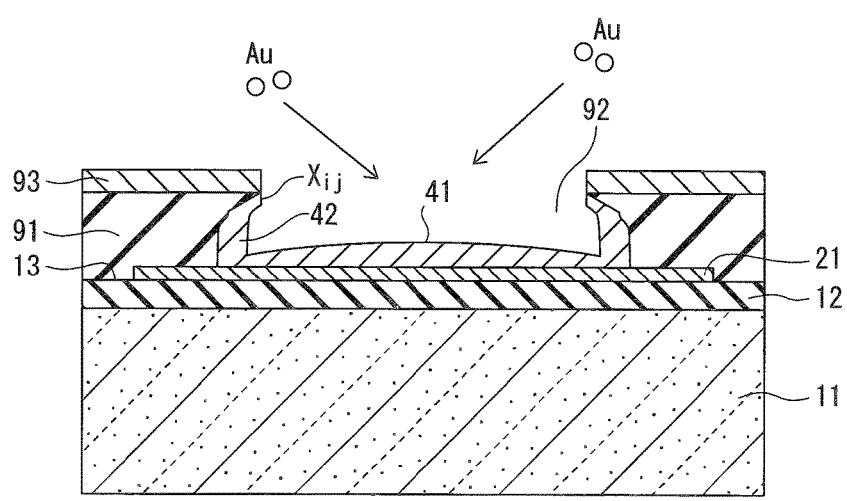
FIG. 15 is an enlarged cross-sectional view taken along arrows XV-XV in FIG. 14.
Figure 16:
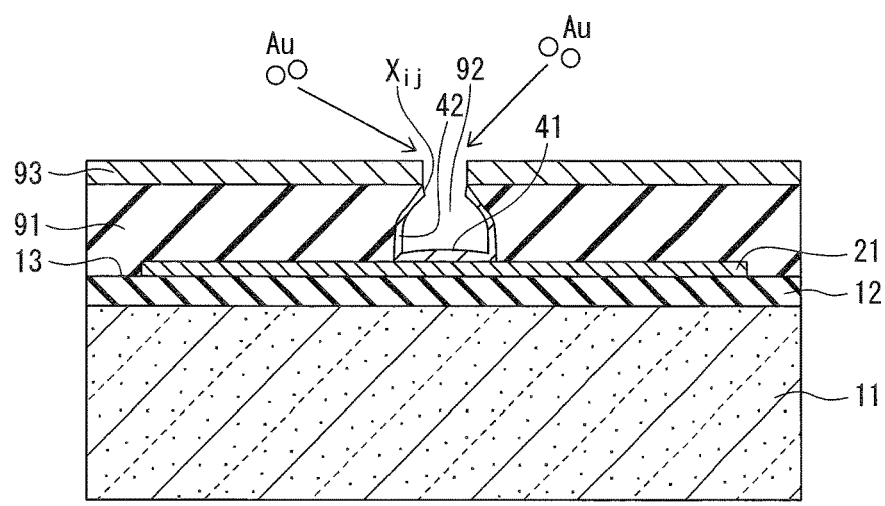
FIG. 16 is an enlarged cross-sectional view taken along arrows XVI-XVI in FIG. 14.

Next, as illustrated in FIGS. 14, 15 and 16, sputtering particles of metal such as Au or Au-alloy are deposited at an incident angle in a specified range to a normal line of the second main-surface 13 by a sputtering method. A target of a sputtering apparatus is Au or the like, and the sputtering particles such as Au are released toward the second main-surface 13 on which the photoresist film 91 is coated. The sputtering particles are deposited on the top face of the second land 21 exposed by the opening 92, on the inner face of the opening 92, and on the top face of the photoresist film 91. Therefore, the incident angle of the sputtering particles and a distance between the target and the substrate are defined such that the sputtering particles are deposited on the entire area of the top face of the second land 21 exposed by the opening 92 and the entire area of the inner face of the opening 92. When the metallic sputtering particles are incident from an oblique direction, the bottom 41 of the tubular bump $X_{ij}$, made of metal, is provided on the top face of the second land 21 exposed by the opening 92, and the side wall 42 made of metal is provided on the inner face of the opening 92. In addition, a metal film 93 is provided on the top face of the photoresist film 91.

At this time, as for the side wall 42 along the minor-axis direction, the inner length of the opening 92 in the major-axis direction is larger than that in the minor-axis direction as illustrated in FIGS. 14 and 15, and amount of deposition of the sputtering particles is large, thereby achieving a high step coverage. Therefore, the side wall 42 along the minor-axis direction is thicker than the side wall 42 along the major-axis direction. On the other hand, as for the side wall 42 along the major-axis direction, the inner length of the opening 92 in the minor-axis direction is smaller than that in the major-axis direction as illustrated in FIGS. 14 and 16, and amount of deposition of the sputtering particles is small, thereby causing a low step coverage. Therefore, the side wall 42 along the major-axis direction is thinner than the side wall 42 along the minor-axis direction.

The side wall 42 of the tubular bump $X_{ij}$ is provided on the inner face of the opening 92 whose upper portion is curved inward such that the inner periphery is minimum at the upper end of the opening 92. With this structure, the side wall 42 has the smallest amount of deposition of the sputtering particles at the upper end and is the thinnest at the upper end. That is, the side wall 42 has the thickness decreasing toward the upper end from the lower end.

Figure 17:
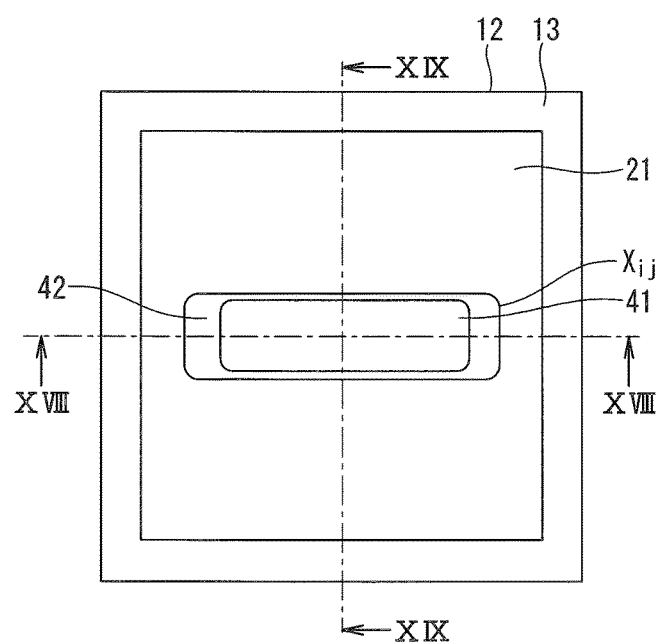
FIG. 17 is an enlarged plan view illustrating a step subsequent to the step illustrated in FIG. 15.
Figure 18:
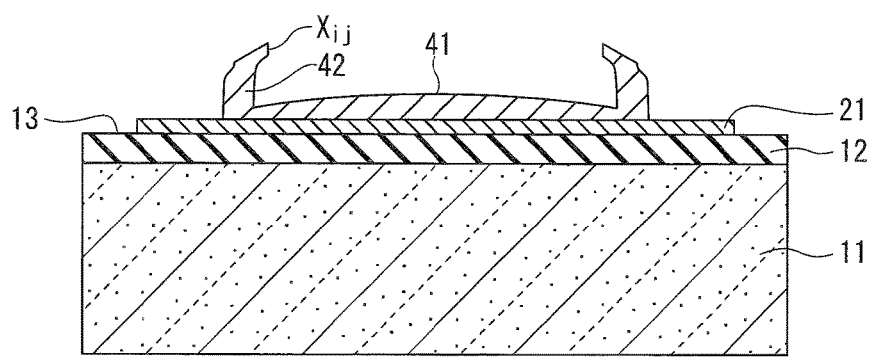
FIG. 18 is an enlarged cross-sectional view taken along arrows XVIII-XVIII in FIG. 17.
Figure 19:
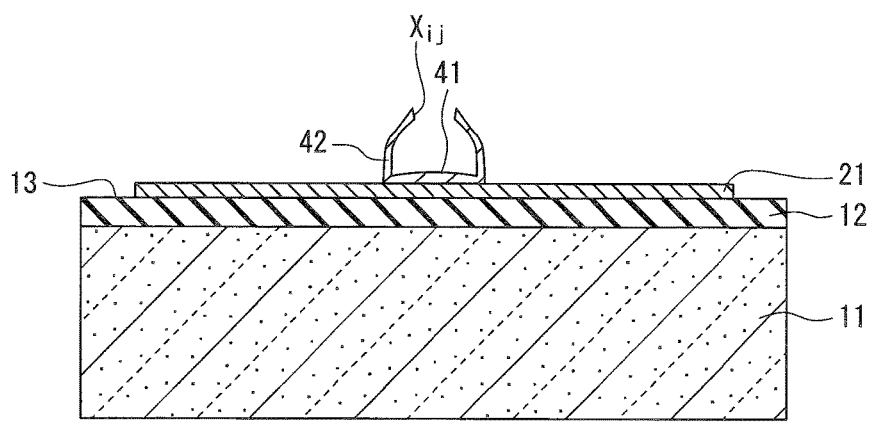
FIG. 19 is an enlarged cross-sectional view taken along arrows XIX-XIX in FIG. 17.

Finally, the tubular bump $X_{ij}$ is provided, as illustrated in FIGS. 17, 18 and 19, by a liftoff process. That is, the photoresist film 91 and the metal film 93 deposited on the top face of the photoresist film 91 are removed, thereby forming the tubular bumps $X_{ij}$ connected onto the top faces of the second lands 21 in a radial layout as illustrated in FIG. 1.

After that, the second main-surface 13 of the signal-circuit substrate 10 on which the plurality of tubular bumps $X_{ij}$ is arranged radially and the first main-surface 53 of the detector substrate 50 are mated to face each other in parallel. The second main-surface 13 and the first main-surface 53 face each other such that the positions of the second lands 21 are aligned to the sites correspond to the first lands 61, respectively. Then, under pressure, heat is applied or ultrasound energy is applied to the mated structure of the signal-circuit substrate 10 and the detector substrate 50. With this process, the upper end of the tubular bump $X_{ij}$ is easily deformed inward and contacts with the bottom face of the first land 61 by surface-to surface contact to perform thermocompression bonding. As a result, the second lands 21 and the first lands 61 are electrically connected to one another via the tubular bumps $X_{ij}$, thereby forming the solid-state imaging device according to the embodiment.

According to the solid-state imaging device of the embodiment of the present invention, the central line of each of the plurality of tubular bumps $X_{ij}$ in the major-axis direction coincides with one of the lines radiating from the center "o" of the first main-surface 53 and the second main-surface 13, as illustrated in FIG. 1. Thus, each of the tubular bumps $X_{ij}$ is arranged along the direction of thermal stress. Hence, even when the signal-circuit substrate 10 and the detector substrate 50 are relatively displaced due to the difference in thermal stress, it is possible to easily maintain the electrical connection.

Since each of the plurality of tubular bumps $X_{ij}$ is easily deformed at the side wall 42 along the major-axis direction, it is possible to reduce the thermal stress. Even when the thin side wall 42 along the major-axis direction of each of the plurality of tubular bumps $X_{ij}$ is broken, the electrical connection can be maintained because of the thick side wall 42 along the minor-axis direction. As described above, according to the solid-state imaging device of the embodiment of the present invention, it is possible to reduce the effect of thermal stress due to the difference in coefficient of thermal expansion between the signal-circuit substrate 10 and the detector substrate 50, thereby improving reliability of the solid-state imaging device.

Since the side wall 42 of each of the plurality of tubular bumps $X_{ij}$ is the thinnest at the upper end, the side wall 42 at the upper end is easily deformed due to the pressure from the first land 61, and contacts with the bottom face of the first land 61 by surface-to surface contact for connection. With the structure pertaining to the solid-state imaging device of the embodiment of the present invention, it is possible to reduce the stress on the detector substrate 50, which has a relatively brittle array chip 52 made of CdTe or CdZnTe, when the pressure is applied on the detector substrate 50.

Other Embodiments

As mentioned above, the embodiment of the present invention has been described. However, the discussions in the text and drawings that implement a part of this disclosure should not be understood to limit the scope of the present invention. From this disclosure, various modifications, implementations and operational techniques would be evident for one skilled in the art.

Figure 20:
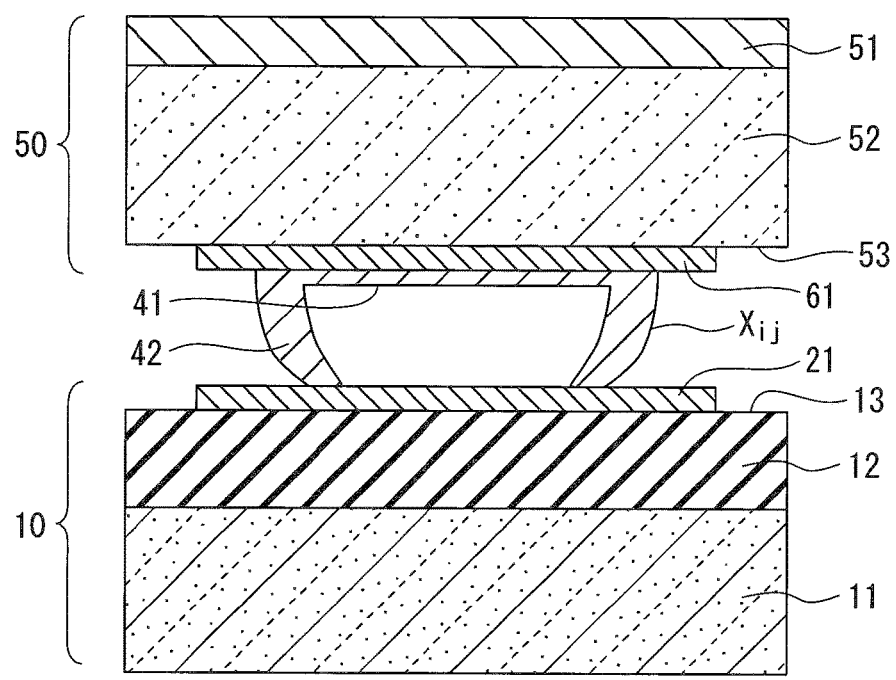
FIG. 20 is an enlarged cross-sectional view illustrating a structure of one pixel of a solid-state imaging device according to another embodiment of the present invention.

In the embodiment of the present invention, for example, each of the tubular bumps $X_{ij}$ is provided on the second main-surface 13 of the signal-circuit substrate 10. However, each of the tubular bumps $X_{ij}$ may be provided on the first main-surface 53 of the detector substrate 50, as illustrated in FIG. 20. In order to provide such tubular bumps, first, the openings each having the major-axis direction directed to the center of the second main-surface 13 as a plane pattern are provided in the photoresist film 91 coated on the second main-surface 13 on which the plurality of second lands 21 is arranged, in analogy with FIGS. 11 to 13. Next, sputtering is performed using the photoresist film 91 as a mask to provide the tubular bumps $X_{ij}$ with the inverse tapered shape on the top faces of the first lands 61, in analogy with FIGS. 14 to 16. Similarly, when the signal-circuit substrate 10 is connected to the detector substrate 50, the tubular bumps $X_{ij}$ are easily deformed, which makes it possible to reduce the stress on the signal-circuit substrate 10 and the detector substrate 50 when the pressure is coated.

Not all of the tubular bumps $X_{ij}$ need to be arranged such that, as a plane pattern, the major-axis direction coincides with one of the lines radiating from the center "o". As illustrated in FIG. 21, for example, the plurality of tubular bumps $X_{ij}$ may be classified into four groups according to four rectangular regions $E_1$, $E_2$, $E_3$, and $E_4$ segmented by four straight lines radiating from the center "o" using equal divide, and the tubular bumps in the same group may lie in the same direction.

The rectangular region $E_1$ has two sides orthogonal to each other extending in X and Y directions from the center "o", respectively. In the group of the rectangular region $E_1$, the maximum thermal stress is applied on the tubular bump $X_{i+4,j+4}$ located farthest from the center "o". Therefore, the major-axis direction of the tubular bump $X_{i+4,j+4}$ coincides with the line $C_1$ radiating from the center "o". The specific radiating line $C_1$ is a line passing through the center "o" and a center of the tubular bump $X_{i+4,j+4}$. Hence, each tubular bump of the group of the tubular bumps $X_{ij}$ on the radiating line $C_1$ has a central axis in the major-axis direction that coincides with the line $C_1$. That is, the inclined angle θ of each of the four tubular bumps arranged lineally on the line $C_1$ is equal to an inclined angle θ of the line $C_1$. The other tubular bumps $X_{ij}$, in the group of the rectangular region $E_1$, deviating from the line $C_1$ have the same inclined angle θ as that of the tubular bump $X_{i+4,j+4}$, and are oriented in the same direction. Therefore, arithmetic processing for defining the inclined angle θ of each of the tubular bumps $X_{ij}$ is unnecessary in CAD, or load of the arithmetic processing can be reduced. Storage capacity of the memory unit in a computer system implementing the CAD can also be reduced, which makes it possible to achieve pattern design in a short time.

The example illustrated in FIG. 21 indicates m=n=2p+1 (odd number) as described above, and there are the tubular bumps $X_{ij}$ located on a boundary between the rectangular regions $E_1$, $E_2$, $E_3$, and $E_4$. The orientation of the tubular bumps $X_{ij}$ on the boundary, i.e., the group of the tubular bumps $X_{ij}$ on the boundary may be optionally defined. For example, the tubular bumps $X_{i,j+1}$, $X_{i,j+2}$, $X_{i,j+3}$ and $X_{i,j+4}$ located on the boundary between the rectangular regions $E_1$ and $E_2$ may belong to the rectangular region $E_1$, and share the same orientation as that of the tubular bump $X_{i+4,j+4}$. The number of the tubular bumps $X_{ij}$ is preferably identical between the rectangular regions $E_1$, $E_2$, $E_3$, and $E_4$ such that the thermal stress on the tubular bumps $X_{ij}$ at the center "o" is zero.

The number of the regions segmented by the plurality of radiating lines passing through the center "o" is not limited to four, and may be more than four. For example, the plurality of tubular bumps $X_{ij}$ may be classified into six groups according to six regions segmented by six radiating lines passing through the center "o" using equal divide. Angles between the X axis and the six radiating lines are 0 degree, 60 degrees, 120 degrees, 180 degrees, 240 degrees, and 300 degrees. The tubular bumps in the same group may be oriented in the same direction. Alternatively, a double structure having an inner rounded-rectangular region and a frame (belt-shaped) region surrounding the inner rounded-rectangular region may be employed to divide the inner rounded-rectangular region into multiple inner regions and to divide the frame region into multiple outer regions such that the number of the outer regions is larger than the number of the inner regions.

The regions segmented by the plurality of radiating lines passing through the center "o" do not have to share the same area (same square measure). That is, the number of the tubular bumps $X_{ij}$ may not be identical between the groups. For example, each region can be defined by various methods depending on the thermal stress on the tubular bumps $X_{ij}$. Preferably, unit vectors parallel to the major-axis directions of the plurality of tubular bumps $X_{ij}$ may be defined as being directed to the center "o" from a center of each of the tubular bumps $X_{ij}$ such that the thermal stress at the center "o" is zero, and the orientation of each of the plurality of tubular bumps $X_{ij}$ may be defined such that sum of the unit vectors is almost zero. In a region within a specified distance from the center "o" where the thermal stress is relatively small, the inclined angle θ of the tubular bump $X_{ij}$ may be arbitrarily defined without respect to the unit vector.

Although the plane pattern of each of the tubular bumps $X_{ij}$ is rounded-rectangular in the above-described embodiments, another plane pattern may be employed, such as an elliptical shape, as long as the plane pattern has a major-axis direction and a minor-axis direction. If the elliptical shape is employed in the example illustrated in FIG. 11, an opening with an elliptical plane pattern is provided in the photoresist film 91 to provide a tubular bump with an elliptical plane pattern. Alternatively, a tubular bump $X_{ij}$ with a further rounded-rectangular plane pattern or an oval plane pattern may be provided depending on the process.

In this way, the present invention naturally includes various embodiments that are not described hereinabove. Thus, the technical scope of the present invention should be determined only by the special technical feature (STF) defining the invention prescribed by Claims, which are reasonable from the above descriptions.

What is claimed is:

1. A solid-state imaging device comprising:
    a detector substrate having a first main-surface, on which
        a plurality of first lands are arranged in a matrix;

a signal-circuit substrate having a second main-surface, on which plurality of second lands are arranged so as to face the arrangement of the first lands; and a plurality of tubular bumps, each of which having a flattened plane pattern, and is provided between each of the plurality of first lands and each of the plurality of second lands, the plurality of tubular bumps respectively having major-axis directions to define inclined angles, being arranged in the matrix such that the inclined angles differ depending on locations of the plurality of tubular bumps.

2. The solid-state imaging device of claim 1, wherein the second main-surface shares a common center with the first main-surface in a plane pattern.

3. The solid-state imaging device of claim 2, wherein at least a part of the plurality of tubular bumps implement a linear arrangement such that the major-axis directions of the plurality of tubular bumps are respectively aligned with a specified line radiating from the center.

4. The solid-state imaging device of claim 3, wherein the detector substrate further has a plurality of solid-state detectors arranged in the matrix, and wherein the plurality of first lands are arranged in the matrix on the first main-surface corresponding to positions of the plurality of solid-state detectors.

5. The solid-state imaging device of claim 4, wherein the signal-circuit substrate further has signal read-out circuits arranged in the matrix for reading out signals from the plurality of solid-state detectors.

6. The solid-state imaging device of claim 2, wherein a region where the plurality of tubular bumps is arranged is divided into a plurality of regions according to a plurality of lines radiating from the center, and first tubular bumps of the plurality of tubular bumps are arranged linearly in each of the plurality of regions such that a major-axis direction of the first tubular bumps is aligned with each of the specified lines, each of the specified lines being a central line of each of the plurality of regions.

7. The solid-state imaging device of claim 6, wherein second tubular bumps of the plurality of tubular bumps are arranged in each of the plurality of regions at an inclined angle identical to that of the first tubular bumps on each of the specified lines.

8. The solid-state imaging device of claim 2, wherein on the specified lines radiating from the center, the major-axis directions of the plurality of tubular bumps are respectively in line with directions of thermal stress due to a difference in coefficient of thermal expansion between the signal-circuit substrate and the detector substrate.

9. The solid-state imaging device of claim 1, wherein each of the plurality of tubular bumps includes a tubular side wall having a first end connected to each of the plurality of second lands and having a second end connected to each of the plurality of first lands, and the tubular side wall along a major-axis direction thereof is thinner than the tubular side wall along a minor-axis direction orthogonal to the major-axis direction.

10. The solid-state imaging device of claim 9, wherein the tubular side wall has inner and outer peripheries decreasing toward the second end from the first end.

11. The solid-state imaging device of claim 10, wherein the tubular side wall has a minimum thickness at the second end.

\* \* \* \* \*